(12) United States Patent
Feriani et al.

(10) Patent No.: US 7,861,943 B2
(45) Date of Patent: Jan. 4, 2011

(54) ADAPTIVE PIEZOELECTRIC ACTUATOR CONTROL SYSTEM

(75) Inventors: Amir Feriani, Auvernier (CH); Joseph Hess, Bevaix (CH); Jean-Paul Sandoz, Cormondreche (CH)

(73) Assignee: EP Systems SA, Neuchatel (CH)

( * ) Notice: Subject to any disclaimer, the term of this patent is extended or adjusted under 35 U.S.C. 154(b) by 166 days.

(21) Appl. No.: 12/249,021

(22) Filed: Oct. 10, 2008

(65) Prior Publication Data

US 2009/0095821 A1    Apr. 16, 2009

(30) Foreign Application Priority Data

Oct. 10, 2007   (EP)   ................... 07118212

(51) Int. Cl.
*B05B 1/08*  (2006.01)
*B05B 3/04*  (2006.01)

(52) U.S. Cl. .................. 239/102.1; 239/102.2; 239/66; 239/71; 239/74; 239/75; 128/200.14; 128/200.16; 310/317; 310/318

(58) Field of Classification Search ............... 239/102.1, 239/102.2, 66, 71, 74, 75; 128/200.14, 200.16; 310/317, 318
See application file for complete search history.

(56) References Cited

U.S. PATENT DOCUMENTS

| | | | |
|---|---|---|---|
| 5,739,724 | A | 4/1998 | Alexandre et al. |
| 6,402,046 | B1 | 6/2002 | Loeser |
| 6,546,927 | B2 | 4/2003 | Litherland et al. |
| 2003/0146300 | A1 | 8/2003 | Denyer et al. |
| 2007/0216256 | A1 | 9/2007 | Vogeley |

FOREIGN PATENT DOCUMENTS

| | | |
|---|---|---|
| DE | 10 2006 002736 | 8/2007 |
| DE | 10 2006 004765 | 8/2007 |
| EP | 0 442 510 | 8/1991 |
| EP | 1 043 162 A1 | 10/2000 |
| EP | 1 129 741 A2 | 9/2001 |
| EP | 1 169 568 | 1/2002 |

(Continued)

OTHER PUBLICATIONS

European Search Report issued in corresponding application No. 07118212.5, completed May 8, 2008 and mailed May 25, 2008.

(Continued)

*Primary Examiner*—Dinh Q Nguyen
(74) *Attorney, Agent, or Firm*—Griffin & Szipl, P.C.

(57) ABSTRACT

Adaptive piezoelectric actuator control system, including:
  a power supply,
  a piezoelectric actuator,
  a driver driving the actuator,
  a signal generator providing a frequency signal to the driver,
  a user interface allowing user input of operating conditions,
  memory storing parameters of the actuator, and
  system control means controlling the power supply, driver generator and memory so operating frequency of the actuator is monitored and regulated,
  wherein the driver comprises
    test means providing a test signal to the actuator,
    voltage measurement means measuring voltage applied to the actuator caused by the test signal and voltage applied to the actuator caused by the frequency signal,
  the system control means receiving a response signal in response to the test, and receiving voltages measured by the voltage measurement means, and comprising signal analysis means creating a response signal envelope and controlling the generator to generate a frequency signal corresponding to the envelope maximum.

18 Claims, 7 Drawing Sheets

FOREIGN PATENT DOCUMENTS

| | | |
|---|---|---|
| EP | 1 952 896 A1 | 8/2008 |
| WO | 01/63121 A1 | 8/2001 |
| WO | 01/76762 A2 | 10/2001 |
| WO | 2004/043502 A1 | 5/2004 |

OTHER PUBLICATIONS

Farzad Pourboghrat et al., "Vibration Control of Flexible Beams Using Self-Sensing Actuators," Electr. & Comput. Eng., Southern Illinois University, Edwardsville, IL, World Automation Congress, 2002. Downloaded on Dec. 15, 2008, pp. 133-140.

ADAPTIVE PIEZOELECTRIC ACTUATOR CONTROL SYSTEM

This application claims priority from European Patent Application No. 07 118 212.5, filed Oct. 10, 2007, the entire disclosure of which is incorporated herein by reference.

FIELD OF THE INVENTION

The present invention relates to an adaptive piezoelectric actuator control system, in particular for a battery-operated liquid droplet spray device.

BACKGROUND OF THE INVENTION

Such droplet spray devices as a battery-operated liquid Droplet spray device are also sometimes called aerosol generators, nebulizers and the like. They normally contain a nozzle body on a support part, in particular, a nozzle body of a liquid droplet spray device which dispenses a liquid substance as a liquid droplet spray or from the device through the nozzles of the nozzle body. They further consist of a piezoelectric actuator used as a vibrating element for causing the liquid to vibrate so to be accelerated and expelled as droplets. They further consist of elements such as a liquid space, liquid feed and fluid interface to a reservoir, a reservoir as well as electrical connections between the vibrating element and a corresponding electronic circuitry. The liquid may be for example an ambient fragrance, a perfume, an insecticide, an aromatherapy essence, a liquid pharmaceutical formulation, aqueous based liquids and flammable or combustible liquids.

Such nozzle bodies are sometimes called aperture plates, nozzle arrays, dosing aperture, orifice plate, vibratable membrane member, dosing aperture arrangement, aerosol generator and the like. Such terms are hence to be understood as being interchangeable throughout the present document.

In fact such nozzle bodies and droplet spray devices are well known. For example see the document EP 1 129 741 in the name of the present Applicant. This document describes a liquid droplet spray device having a top substrate formed of a main body and of a nozzle body. The nozzle body contains a nozzle array of liquid droplet outlet means allowing a liquid substance contained in the liquid droplet spray device to exit the device, in this case as a spray of droplets. A piezoelectric actuator is used to cause the liquid to undergo a vibration so as to generate the droplet spray.

Generally, such piezoelectric actuator is driven so as to oscillate at or near its resonance frequency to improve energy efficiency.

Further, it is known that temperature deviations result in changes of the electrical characteristics so that it is important to control the operating frequency of the piezoelectric actuator.

Also, once a reservoir is empty, it is preferable to stop the piezoelectric actuator so as to avoid wasting energy. Moreover, if the piezoelectric actuator continues functioning once the reservoir is empty, there is a risk that the liquid supply means will dry out. When a wick is used for supplying the liquid this has a disadvantage that undesirable smells may emanate from the wick in such circumstances. Once a new reservoir is added, it may be difficult to control the amount of liquid that will be expelled, because the wick must first be saturated with liquid before it can function properly, in particular with a heat-diffusing device.

Many piezoelectric actuator control systems are known as such.

For example, the article "Vibration control of flexible beams using self-sensing actuators" by F. Pourboghrat et al., Electr. & Comput. Eng., Southern Illinois Univ., Edwardsville, Ill., USA; World Automation Congress, 2002. Proceedings of the 5th Biannual, Volume: 14, pages 133-139, ISBN: 1-889335-18-5 describes a design and implementation of a smart piezoelectric actuator for active vibration control of flexible structures. A disturbance estimation technique is used for estimating the induced strain on a piezoelectric actuator, which results in a self-sensing piezo-actuator. The proposed self-sensing piezo-actuator is then applied for the elimination of vibration in a flexible beam structure, using a simple rate-feedback control. Simulation and experimental results for a cantilever beam are shown to demonstrate the accuracy of the proposed self-sensing actuator for vibration control.

The document EP 1 043 162 describes an inkjet apparatus having a liquid detection method using an infrared detector to determine if liquid has passed through a spray path or not. Control means are provided to adjust the spraying itself.

Document EP 1 169 568 describes a fuel injector using a piezoelectric actuator that acts on the fuel injector when voltage is applied to it. The resulting mechanical load applied to the piezoelectric actuator will generate an electric charge such that the electric charge is proportional to the mechanical load. The electric charge will be retained as long as the mechanical load is applied. By monitoring the voltage of the electric charge, it is possible to control the injected fuel. However, the fuel injector described in this document only relates to the use of one liquid substance, i.e. fuel, and does not at all detect the status (empty or not) of the liquid reservoir.

The document DE 10 2006 002 736 describes another example of a fuel injection. By measuring the current supplied to the piezoelectric actuator, it is possible to control the operation thereof. This document is also silent about the state of the reservoir, and only uses one type of liquid.

A further example of such system is described in the document DE 10 2006 004 765.

The document US 2007/0216256 describes a drive control circuit for a piezoelectric activated pump. By measuring the internal impedance of the piezoelectric actuator, it is possible to control the operation frequency.

Document US 2003/0146300 describes a nebulizer for nebulizing a substance and a reservoir having a metering chamber arranged so as to feed a substance to be nebulized to the nebulization device and a second chamber arranged to hold and retain any of this substance in excess of the volume held in the metering chamber. The device allows detecting the ejection of a unit dose, so that in principle an empty reservoir may be detected, but this is done by measuring the amount of ejected substance by way of the metering chamber.

The document U.S. Pat. No. 6,546,927 describes an aerosol generator having frequency control means that uses the internal impedance of the piezoelectric actuator to track the actual frequency. By measuring the current, the frequency applied can be controlled, seeing that at resonance, the current is lowest, as the internal impedance is lowest. However, this point is not the most stable, i.e. a slight shift in frequency can cause a large shift in impedance change as shown in FIG. 2 of this document, so that a trade-off in consumed current and frequency needs to be made.

However, this document, or any of the other cited documents, is silent about any influence or control of liquid viscosity or of ambient temperature which both have a direct impact on the operation characteristics of a piezoelectric actuator. For example, in the above-cited U.S. Pat. No. 6,546, 927 a change in the ambient temperature may cause a shift of the frequency away from the resonance frequency.

It is, therefore, an object of the present invention to provide an innovative piezoelectric actuator control system for a liquid droplet spray device that overcomes the inconveniences and limitations presented by the prior art documents.

SUMMARY OF THE INVENTION

Thus, the present invention concerns an adaptive piezoelectric actuator control system fulfilling these objectives efficiently which may be obtained in a relatively simple and inexpensive manner, as follows generally. In accordance with a first embodiment of the invention, an adaptive piezoelectric actuator control system for a liquid droplet spray device is provided that includes: (a) power supply means (1, 2); (b) a piezoelectric actuator; (c) a driver (3) for driving the piezoelectric actuator so as to activate the liquid droplet spray device (8); (d) a signal generator (7) for providing a frequency signal to the driver (3) for driving the piezoelectric actuator (8) at a frequency as defined by the frequency signal; (e) a user interface (4) for allowing a user for inputting operating conditions of the liquid droplet spray device (8); (f) memory means for storing internal and external parameters of the piezoelectric actuator; and (g) system control means (5) for controlling the power supply means (2, 3), the driver (3), the signal generator (7) and the memory means (6) so that the operating frequency of the piezoelectric actuator is monitored and regulated in time such that the piezoelectric actuator operates correctly while consuming as little power as possible, wherein the driver (3) comprises (i) test signal means for providing a test signal is provided by the signal generator (7), (ii) voltage measurement means for measuring a voltage applied to the piezoelectric actuator caused by the test signal, and for measuring a voltage applied to piezoelectric actuator caused by the frequency signal, wherein the system control means (5) receives a response signal in response to the test signal, and receives the voltages measured by the voltage measurement means, and comprising signal analysis means for creating an envelope of the response signal and controlling the signal generator to generate a frequency signal corresponding to the maximum of the envelope.

In accordance with a second embodiment of the present invention, the first embodiment is modified so that the memory means (6) is pre-stored with envelopes of the response signal when the piezoelectric actuator is arranged to activate a liquid droplet spray device with a filled reservoir and with an empty reservoir, wherein the system control means is further arranged to compare the envelope created by the system control means with the pre-stored envelopes to determine if the piezoelectric actuator is connected to an empty reservoir or to a filled reservoir. In accordance with a third embodiment of the present invention, the first embodiment is modified so that the memory means (6) is further arranged to store envelopes of response signals for different ambient temperature of the piezoelectric actuator, wherein the system control means is further arranged to compare the created envelope with the pre-stored temperature-envelopes so as to determine the temperature of the piezoelectric actuator. In accordance with a fourth embodiment of the present invention, the second embodiment or the third embodiment are further modified so that the memory means (6) is further arranged to store envelopes of response signals for different viscosities of liquids in the reservoir when the piezoelectric actuator is arranged to activate a liquid droplet spray device with a filled reservoir, wherein the system control means is further arranged to compare the envelope created by the system control means with the pre-stored envelopes to determine the operating frequency for a specific viscosity of a liquid when the piezoelectric actuator is connected to a reservoir.

In accordance with a fifth embodiment of the present invention, any one of the first, second, third and fourth embodiments may be further modified so that the voltage measurement means comprises a first impedance (3.1) connected between the driver (3) and the piezoelectric actuator for determining a first voltage (A) applied to the piezoelectric actuator, and a first voltage determining branch connected between the piezoelectric actuator and the system control means (5) for providing a value of the first voltage to the system control means. In accordance with a sixth embodiment of the present invention, any one of the first, second, third, fourth and fifth embodiments may be further modified so that the adaptive piezoelectric actuator control system further comprises a plurality of piezoelectric actuators, each piezoelectric actuator arranged to drive a liquid droplet spray device, and a switch (9) for sequentially selecting one of the plurality of piezoelectric actuators, wherein the switch is controlled by the system control means (5). In accordance with a seventh embodiment of the present invention, any one of the first, second, third, fourth fifth and sixth embodiments may be further modified so that the system control means is further arranged to activate one of the piezoelectric actuator so as to heat the piezoelectric actuator, thereby reducing the viscosity of any liquid being acted on by the piezoelectric actuator so as to control the flow rate of the liquid droplet spray device.

In accordance with an eighth embodiment of the present invention, the fifth embodiment of the present invention is modified according to the sixth embodiment, and is further modified so that the voltage measurement means further comprises a second impedance (3.7) for measuring a second voltage (B), wherein the second impedance is connected between the driver (3) and the selective switch (9) for providing a value of the second voltage to the system control means.

In accordance with a ninth embodiment of the present invention, any one of the first, second, third, fourth, fifth, sixth and seventh and eighth embodiments is further modified so that the memory means (6) comprises a look-up table having fabrication parameters of the piezoelectric actuator pre-stored there in. In accordance with a tenth embodiment of the present invention, any one of the first, second, third, fourth, fifth, sixth, seventh, eighth and ninth embodiments is further modified so that the internal parameters comprise time-dependent frequency response signals of the piezoelectric actuator for several different temperatures. In accordance with an eleventh embodiment of the present invention, any one of the first, second, third, fourth, fifth, sixth, seventh, eighth, ninth and tenth embodiments is further modified so that the external parameters comprise ranges of viscosities of liquids at specific temperatures to be used with the liquid droplet spray device. In accordance with a twelfth embodiment of the present invention, any one of the first, second, third, fourth, fifth, sixth, seventh, eighth, ninth, tenth and eleventh embodiments of the present invention are further modified so that the system control means is configured to control the operating frequency by using fuzzy logic.

The present invention also relates to an atomiser comprising the adaptive piezoelectric actuator control system according to the present invention, as follows generally. In accordance with a thirteenth embodiment of the present invention, an atomiser (11) is provided that includes: (A) a plurality of liquid droplet spray devices; (B) a selector for sequentially selecting one of the liquid droplet spray devices, and (C) an adaptive piezoelectric actuator control system as defined by any one of the first, second, third, fourth, fifth, sixth, seventh, eighth, ninth, tenth, eleventh and twelfth embodiments. In accordance with a fourteenth embodiment of the present invention, the thirteenth embodiment is modified so that each liquid droplet spray device has a removable reservoir for containing liquid to be ejected as a spray. In accordance with a fifteenth embodiment of the present invention, the fourteenth embodiment is further modified so that the reservoir is provided with identification means indicative of the viscosity of a liquid contained therein. In accordance with a sixteenth embodiment of the present invention, any one of the thirteenth, fourteenth and fifteenth embodiments is modified so that the atomiser further includes a first indicator for indicating that the reservoir is empty, wherein the first indicator is controlled by the system control means (5). In accordance with a seventeenth embodiment of the present invention, any one of the thirteenth, fourteenth and fifteenth and sixteenth embodiments is further modified so that the atomiser further includes a second indicator for that one of the liquid droplet spray devices is malfunctioning, wherein the second indicator is controlled by the system control means (5).

Thanks to the features of the piezoelectric actuator control system according to the present invention, it is possible to reliably detect the status, i.e. empty of not, of a liquid reservoir. Further, it is possible to ensure correct operation for a relatively large range of viscosity of liquids to be sprayed, such as perfume, fuel, air-fresheners or the like, and this without requiring any sensor.

Furthermore, due to the specific design of the piezoelectric actuator control system according to the present invention, it is possible to control a spray device having a plurality of atomisers without a risk of emptying one or more of the atomisers much more quickly than the other.

BRIEF DESCRIPTION OF THE DRAWINGS

Other features and advantages of the piezoelectric actuator control system according to the present invention will become clear from reading the following description, which is given solely by way of a non-limitative example thereby referring to the attached drawings in which.

DETAILED DESCRIPTION OF THE INVENTION

An example of a preferred embodiment will now be described while referring to the figures. Generally, the adaptive piezoelectric actuator control system according to the present invention is used to control the operation of the piezoelectric actuator in a liquid droplet spray device. The liquid droplet spray device may have more than one output means, each output means having its own piezoelectric actuator and reservoir. As is known from inkjet printers, it is rather annoying to have one or more reservoirs still substantially filled, but where the reservoirs need to be exchanged in anyway, because one is empty. In an atomiser arrangement having a plurality of liquid droplet spray devices, each capable of ejecting a different liquid, for example a different fragrance in the case of air-fresheners, the same problem exists. The present invention overcomes this problem, and allows controlling the ejection of each liquid droplet spray device such that all reservoirs will empty at substantially the same time, as will become apparent from the following detailed description.

Figure 1:
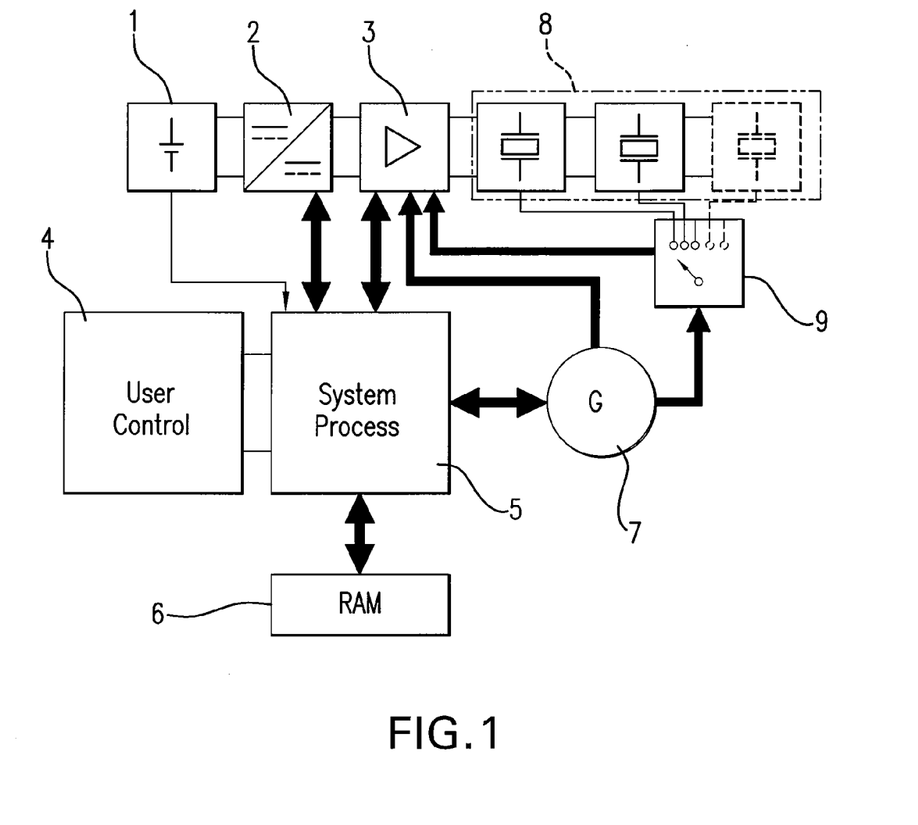
FIG. 1 shows an example of a general block diagram for an adaptive piezoelectric actuator control system according to the present invention.

As shown in FIG. 1, the adaptive piezoelectric actuator control system according to the present invention comprises a power supply 1 connected to a DC/DC converter 2 for supplying power to a driver 3 which is arranged to drive one or more liquid droplet spray devices, or atomisers 8. The power supply 1 may be battery powered, for example by AA batteries. In this example, 3 AA batteries, of 1.5 Volt per battery, are provided to drive three atomisers 8, each containing a piezoelectric actuator. Of course, the number of batteries depends on the number of atomisers to be driven and the total sprayed volume of liquid over time. DC/DC converter 2 converts this power to obtain a useful voltage to operate the other components of the system. A user interface, i.e. user control means 4 is further provided allowing a user to control the system by inputting settings according to programs for operating the atomiser. Of course, this user control may be wired or wireless. The system further comprises a system processor 5, which may be a CPU, a memory means 6 and a signal generator 7. An electronic switch 9 is connected between the driver 3, the signal generator 7 and the atomisers 8 so as to allow for selection of the atomisers. Preferably, this switch operates in a sequential manner to switch from one atomiser to the next, for example when one is considered to be empty, or when a user has programmed the system so as to change fragrance like in a periodic manner.

CPU 5 controls and analyses system signals, for example by using pattern classification analysis, to allow monitoring of the operation of the system. It further is arranged to check and control external parameters, such as the ambient temperate and the state of the reservoir, i.e. if it is empty or not, as will be explained in more detail further on. Memory means 6, for example a RAM, is used to store data Resulting from analyses and measurements performed by the system. By storing these data, it is possible to follow the evolution of the dynamic parameters of the system atomisers, such as the internal parameters of the piezoelectric actuators, over a period of time. The internal parameters may thus be the physical characteristics of the piezoelectric elements used in the actuators. This allows for a time-dependent signal processing by the system.

Signal generator 7 may be for example a DDS (Digital Direct Synthesiser), a VCO (voltage controlled oscillator) or a PLL (Phase Locked Loop) and provides the operation frequency to each of the atomisers. It further generates all signals required to analyse the dynamic parameters of the atomiser and to ensure the optimum operation of the atomisers. Both the frequency and the amplitudes may be further controlled by this generator 7.

Driver 3 thus drives the atomisers by controlling the frequencies and voltages applied to the piezoelectric actuators.

Figure 3:
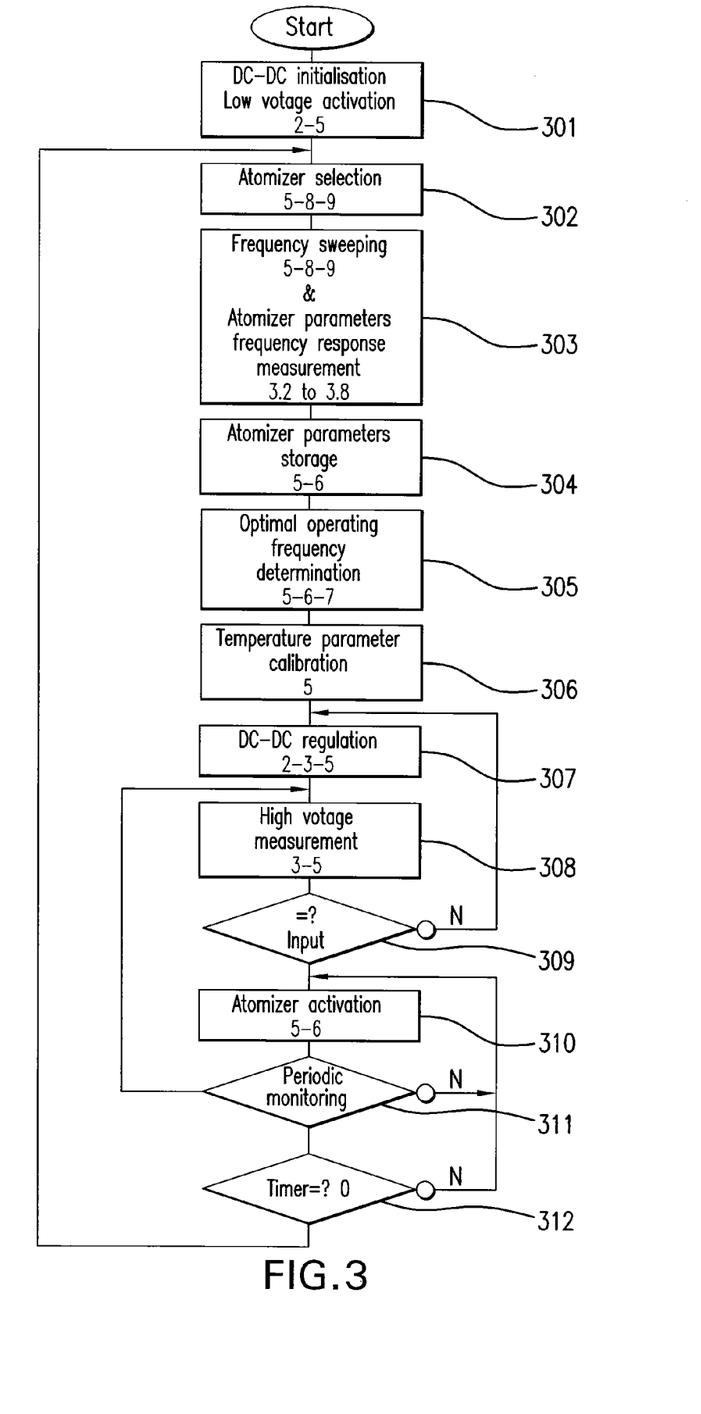
FIG. 3 shows a flow chart of the operation steps of the adaptive piezoelectric actuator control system according to the present invention in a first operation mode.

All the blocks of the system shown in the FIG. 3, except for block 8 relating to the atomisers, may be completely or partially integrated in an ASIC.

According to the present invention, the driver can operate in two distinct modes: a first so-called non-linear mode which corresponds to the operating mode for supplying signals to the atomisers necessary for their functioning, and a second linear mode which corresponds to the measuring and analysing mode for measuring and analysing the signals so as to optimise the behaviour of the atomisers and to maximise energy efficiency of the system.

Figure 2:
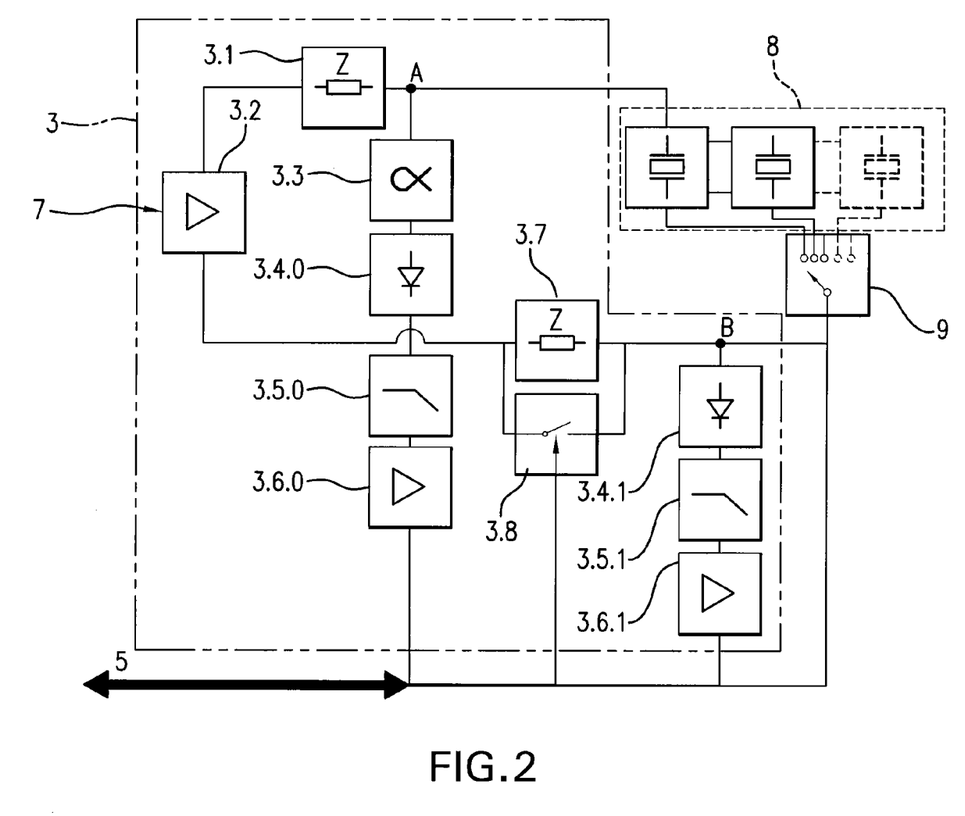
FIG. 2 shows an example of a block diagram of the driver of the control system of FIG. 1.

FIG. 2 shows in more detail an example of a block diagram of driver 3. As mentioned above, according to the present invention, the driver may operate in two distinct modes, one for ensuring the correct functioning of the atomisers, and one for measuring and analysing the internal parameters of the atomisers, thus allowing for a control by the system.

In fact, in principle, it is possible to deduct information relating to the internal parameters directly from the driving signals, but this is very limited. By introducing a separate measuring mode that is activated periodically and intermittent with the normal operation of an atomiser, a much more reliable analysis may be obtained.

As shown in FIG. 2, the driver comprises an operational amplifier, power amplifier 3.2, that receives a generated signal at its input from frequency generator 7. Amplifier 3.2 is connected in a first branch to an impedance matching circuit 3.1, referred to hereafter as first impedance, which is connected to a set of atomisers 8. First impedance 3.1 is required to adapt the impedance of the driver to that of the piezoelectric actuators of the atomisers so as to allow for the most efficient output. It is also used to measure the voltage that is provided to the piezoelectric actuators at point "A" in the branch from impedance 3.1 to the atomisers. As is known, the electric parameters of a piezoelectric actuator changes with its load. By measuring the voltage at point "A", a clear indication of the load may thus be obtained, which can then be used to control the system, as will be explained in more detail with respect to FIG. 3. Another branch connects point "A" to an output connected to an input/output terminal of CPU 5. This branch comprises, in this example, a connection of an attenuator 3.3 for reducing the voltage at point "A", which may be for example 130 Volts peak-to-peak in the measuring mode, down to a voltage compatible with the rectifier (3.4.0) power supply, i.e. around 2 to 3 Volts, a rectifier 3.4.0, a low-pass filter 3.5.0 and an amplifier 3.6.0, which is used in this example to adapt the output impedance of the measuring circuit to the input impedance of the CPU. This branch thus allows to measure the voltage magnitude at point "A" and to provide the result to the CPU 5 for control by the system.

Amplifier 3.2 is connected in a second branch to a parallel connection of an electronic switch 3.8 and a second impedance 3.7. Second impedance 3.7 is provided to allow a further voltage measurement across this impedance, to determine the voltage at point "B". This voltage can be determined with switch 3.8 open, i.e. the current passing through impedance 3.7, or with switch 3.8 closed, i.e. a short-circuit with respect to impedance 3.7. Similar to the connection of point "A" above, point "B" is also connected to the CPU by way of a series connection of a rectifier 3.4.1, a low-pass filter 3.5.1 and an amplifier 3.6.1. This branch thus allows to measure the voltage at point "B" and to provide the result to the CPU 5 for control by the system. The value of impedance 3.7 is chosen such that the voltage can be reliably determined. Point "B" is further connected to sequential switch 9 for selecting an atomizer. This sequential switch 9 is also connected to CPU 5 thus allowing control of this switch by CPU 5.

Switch 3.8 thus allows current to flow through impedance 3.7 which may be a measuring element used to characterise the behaviour of an atomiser by way of electrical measurements.

As can be understood from the above, by measuring the voltages at points A and B, it is possible to determine the internal parameters of the atomisers, i.e. of the piezoelectric actuators.

FIG. 3 shows a flow chart of the operation steps of the adaptive piezoelectric actuator control system according to the present invention in a first operation mode, i.e. in the normal activation mode, also called the non-linear mode.

First, in step 301, a DC/DC initialisation is started, and a low voltage is provided to the different elements DC/DC converter 2, driver 3, user controller 4, CPU 5 and RAM 6 to start operation of the control system. Next, in step 302, an atomiser 8 is selected by activating selective switch 9 to select an atomiser, as controlled by CPU 5. In this embodiment, the atomisers operate sequentially, not together. In step 303, a frequency sweeping is carried out to determine the operation frequency of the atomiser. Driver 3 is activated by sending a drive test signal at different frequencies from generator 7 and providing such to a piezoelectric actuator, and the voltage at first impedance 3.1 is measured, while switch 3.8 is closed so as to short-circuit second impedance 3.7 for the entire range of frequencies along the sweep, and this at a lower than normal operating voltage.

The test signal typically is a block-type signal of constant amplitude and variable frequency which passes through a common band-pass filter, not shown, before being amplified by amplifier 3.2 of driver 3. As mentioned above, amplifier 3.2 is connected to an atomiser 8 through first impedance 3.1. An optimal operation configuration is determined such that a maximum flow is obtained at a lowest possible power consumption. This optimal operation configuration is determined by measuring the envelope of the response signal of this test signal over time, thus the signal that passes through first impedance 3.1 and then through the branch with components attenuator 3.3, rectifier 3.4, low-pass filter 3.5 and amplifier 3.6.

Figure 4:
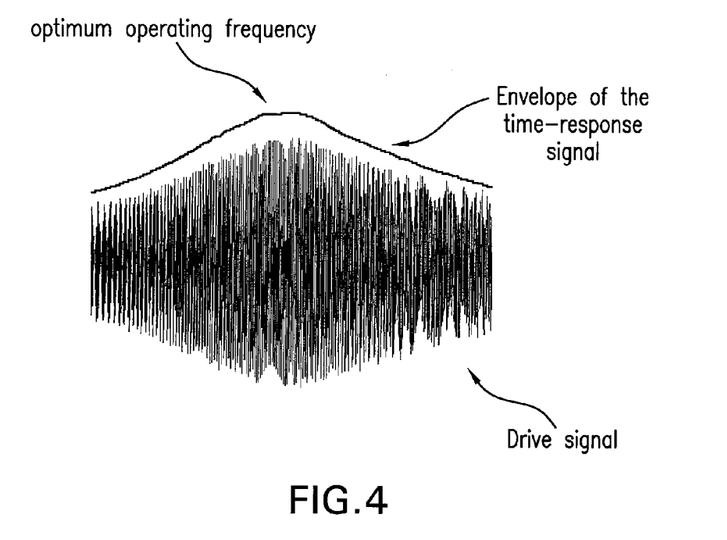
FIG. 4 shows a view of a drive signal (shown decimated for clarity) used for analysing and controlling by the adaptive piezoelectric actuator control system according to the present invention.

FIG. 4 shows an example of the drive signal (shown under sampled for clarity), and the envelope of the response signal used in determining the optimum operating frequency and voltage supply of the amplifier 3.2. In fact, by finding the peak of this envelope, the optimum operating frequency is found.

Such test signal is sent periodically through the branch so as to allow adapting the operating frequency and the voltage supply of the amplifier 3.2, as a function in time of the operation of the atomiser. For example, due to ambient temperature changes, the atomiser might operate at a different frequency in a more efficient manner, so that by checking the envelope of the response signal, the new peak can be detected which thus gives the new optimum operating frequency.

Back to FIG. 3, in the following step, step 304, the just measured parameters of the atomiser, obtained in response to the test signal, are stored in RAM 6 by CPU 5. In step 305, the optimum operating frequency is determined, by analysing the obtained envelope of the response signal, as explained with respect to FIG. 4 above.

Next, in step 306, a temperature parameter calibration is performed. In fact, as mentioned above, RAM 6 may store parameters from the piezoelectric actuator. Upon fabrication, several parameters may be measured, and then stored, for different ambient temperatures. Thus, the unloaded piezoelectric actuator characteristics, i.e. when no charge is applied to the piezoelectric actuator, at different temperatures may be stored. Likewise, reference loaded piezoelectric actuator characteristics at different temperature and viscosity may be stored. Once the atomiser is activated, and the system starts its measurements, the optimum operating frequency is determined. This frequency will thus correspond to a certain ambient temperature. By comparing the frequency with one pre-stored in the RAM, for example in a look-up table, the corresponding ambient temperature may thus be found.

It should be noted that such look-up table of RAM 6 may also store information relating to liquids to be used for spraying by the atomiser. For example, for several perfumes, a certain viscosity at a certain temperature may also be pre-stored.

Next, in step 307, the supply voltage is changed, by means of DC/DC converter 2 to obtain a high voltage, in this example around 130 Volts. In step 308, the high-voltage measurements are carried out, and again an envelope is obtained, by measuring the voltage across impedance 3.1, but now for a higher voltage as compared to the first measurement. This measurement makes it possible to regulate the voltage and the frequency applied to the atomizer according to the input by using a regulation feedback loop.

In step 309, user input parameters are checked, and the system compares if the atomisers function according to the conditions programmed by the user. If not, indicated by "N" for "No", the method returns to step 307 to adjust the voltage and perform a further high-voltage measurement.

If the user program conditions are respected, the method continues towards step 310 and the selected atomiser is operated at the determined optimum operating frequency, for the given ambient temperature, and possibly also for a given viscosity of a liquid to be sprayed.

Step 311 relates to a periodic monitoring of the system, by carrying out periodic measurements, by returning to step 306 to ensure a correct operation of the atomiser with time. Thus, even if there is a temperature change, the operating frequency of the atomiser is further controlled to remain at an optimum operating frequency. This step also checks if the atomiser is still active, in view of the user preference, see the loop back to step 310.

Finally, in step 312, the user-programmed operation time is checked, and if this has been reached, the system stops the atomiser. Otherwise, the control returns to step 302.

Figure 5:
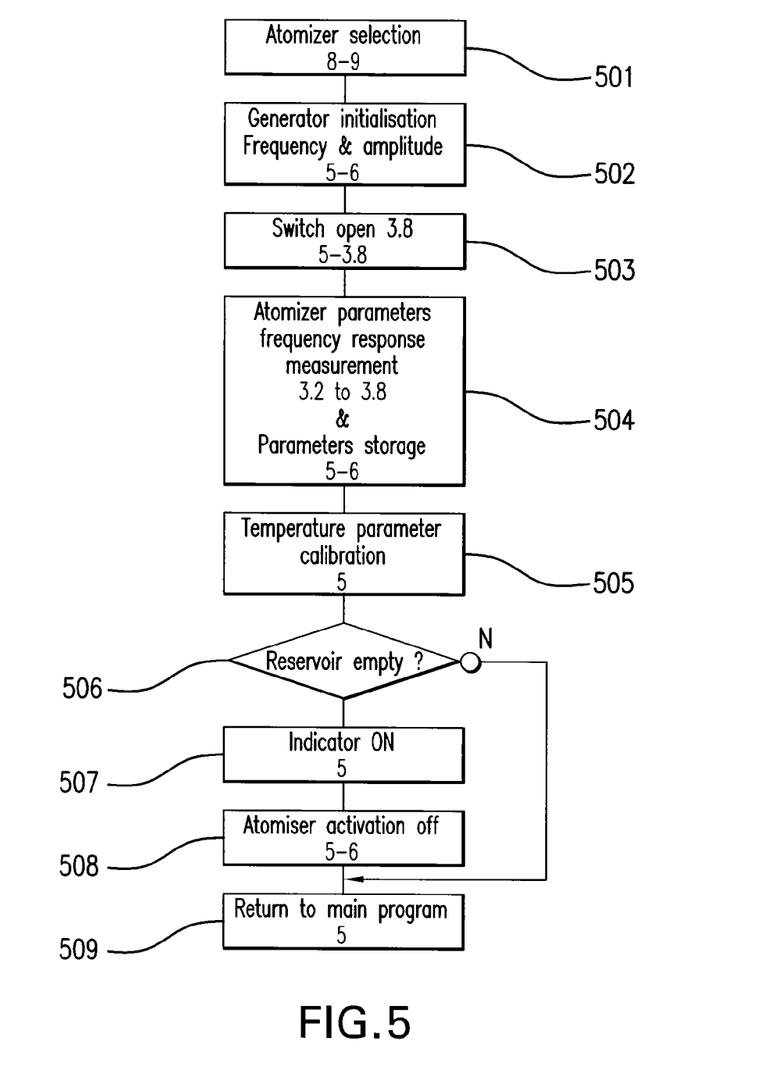
FIG. 5 shows a flow chart of the operation steps of the adaptive piezoelectric actuator control system according to the present invention in a second operation mode.

As mentioned above, according to the present invention, it is possible to measure and analyse the operation of the piezoelectric actuator to ensure a correct functioning over time. A measuring and analyse mode, also called the linear mode, is entered periodically to carry out the required measurements. FIG. 5 shows the operational steps of this linear mode.

In step 501, an atomiser is selected for measuring. In step 502, the signal generator 7 is activated by CPU 5 to initialize a signal with a specific frequency and amplitude. The parameters of initialisation are stored in the RAM. These parameters may depend on the selected atomiser's spray head, the type of liquid, its viscosity and/or the ambient temperature.

Next, is step 503, switch 3.8 is opened, to allow for measurements of the voltage across second impedance 3.7.

Then, in step 504, and in a manner similar to that above in step 303, the atomiser parameters are measured by applying a signal, across a large frequency range using a frequency sweep, and the voltage across second impedance 3.7 is measured for each frequency so as to obtain another time-dependent response signal. Again, the envelope of this signal is considered and compared to values pre-stored in RAM 6.

Thus, again a block signal of constant amplitude and variable frequency, generated by generator 7, is applied to the system by first passing through a standard band-pass filter (not shown) before being applied to driver 3 and its amplifier 3.2.

Now, the envelope of the response signal through the branch comprising second impedance 3.7, rectifier 3.4.1, low-pass filter 3.5.2 and amplifier 3.6.1 is measured and input to CPU 5 for analysis. This envelope signal represents the parameters of the atomiser over a range of frequencies, as applied by the frequency-swept test signal.

An initial measurement, carried out whilst the atomiser does not have any liquid and its reservoir is empty, allows to obtain a resulting envelope signal which is pre-stored in RAM 6. Next, a measurement is carried out on the atomiser during operation with liquid contained in the reservoir. This will result in a different envelope signal.

Figure 6:
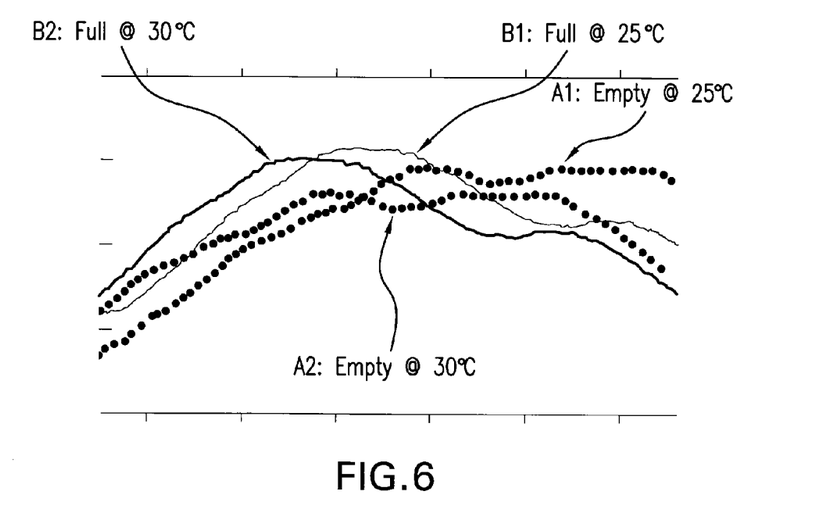
FIG. 6 to 8 show examples of signals allowing to detect the state of a liquid reservoir of a liquid droplet spray device obtained by the adaptive piezoelectric actuator control system according to the present invention.

In fact, as shown in FIG. 6, a first envelope signal for an empty reservoir is presented by interrupted line A1 for a specific ambient temperature, in this example 25° C. A second envelope signal A2 is obtained for a different ambient temperature, in this example 30° C., still for an empty reservoir. Thus, several envelope signals for a range of ambient temperatures are measured at initialisation and are stored in RAM 6. Once liquid is provided by way of a filled reservoir, the same test signal is applied, and a new envelope response signal is obtained, see curves B1 and B2, again measured at, respectively 25° and 30° C. As can be seen from FIG. 6, this envelope signal differs in time, frequency and amplitude from the empty reservoir envelope signal.

Therefore, by comparing these envelope signals, it is possible to determine if the reservoir is empty or not.

By repeating the measurements over time, it is thus possible to determine the moment that the reservoir is empty. An indicator may be provided to warn a user that the reservoir is empty and may need replacing.

Back to FIG. 5, the temperature is determined for calibration of the atomiser, i.e. the correct envelope signal to be considered is checked by comparison with the pre-stored envelope signal for different temperatures in the look-up table in RAM 6.

In step 506, the envelope signal is periodically checked with the stored envelope signal of an empty reservoir. If the reservoir is determined to be filled, the method goes to step 509 and stops, and the system exits the linear measurement mode back to main mode, i.e. the operating mode.

However, if the reservoir is determined to be empty, the process continues to step 507, where an indication is activated, for example a warning light is turned on, to show the user that the reservoir of an atomiser is empty.

In step 508, the atomiser is switched off to avoid unnecessary power consumption and to avoid possible drying out of the liquid supply means. Then, the method stops in step 509, and, as above, the measuring mode is exited and the system returns to the normal operating mode.

As can be understood from the above, an empty reservoir can be readily detected by comparing the obtained envelopes of the response signals.

However, it is also possible to determine if the atomiser is functioning correctly. Indeed, if the obtained envelope signal is different from both the empty envelope signal and the filled envelope signal, it may be considered that there is a problem, for example due to clogging of the atomiser, or some other malfunctioning. IN such case, a further indication may be provided to inform the user that there is a malfunctioning, or that the user needs to clean the device to avoid further malfunctioning.

Figure 7:
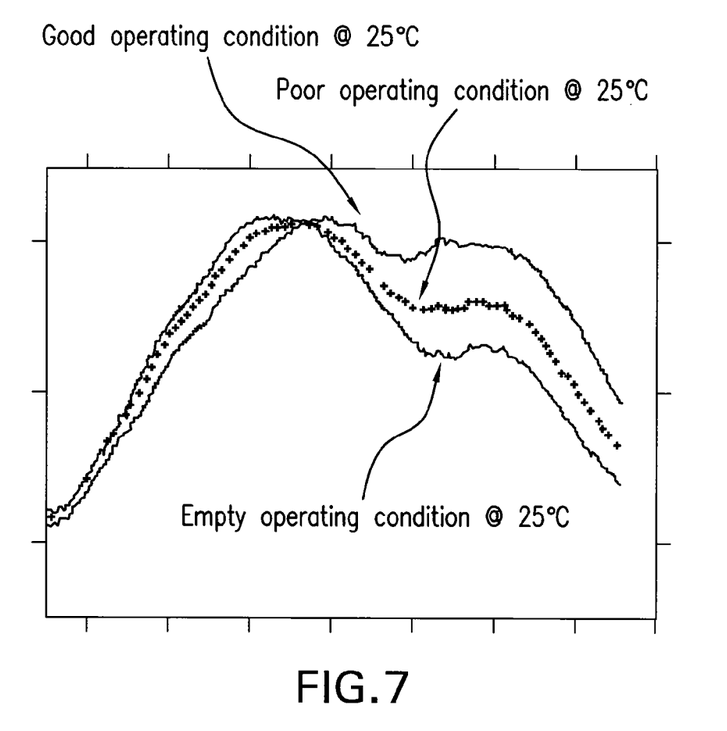

FIG. 7 shows an example of such envelope signals at a specific ambient temperature, in this case 25° C. An envelope signal corresponding to the empty reservoir is shown. Also shown is the normal, reservoir filled, envelope which is indicative of a good operation, whereas a further envelope signal is shown, which lies in-between the two other envelopes in this example, and which is indicative of a poor operation, i.e. some malfunctioning.

Figure 8:
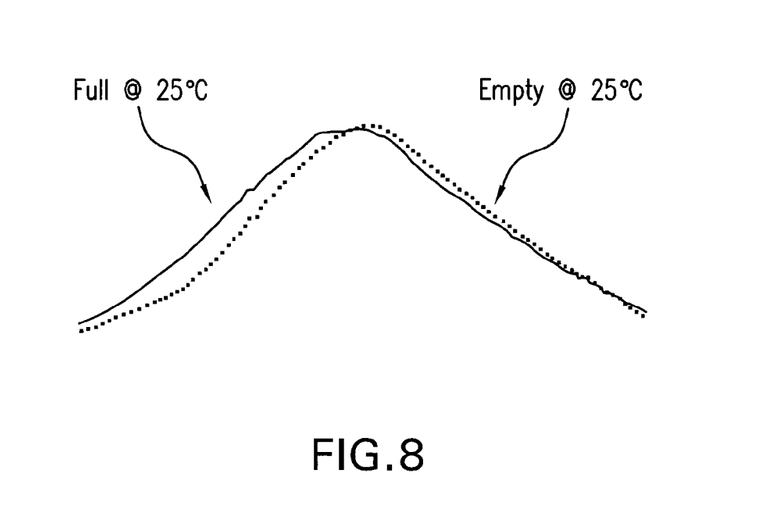

In a variant, it is possible to measure the response signal across the high voltage branch, i.e. across first impedance 3.1. However, in this case, the difference between the filled reservoir envelope signal and the empty reservoir envelope signal is much smaller, as compared to the low-voltage measurement explained above with reference to FIG. 6. FIG. 8 shows an example of such signals obtained over the high-voltage branch. In this case, it is preferable to add a small impedance in series with first impedance 3.1 to improve the sensitivity of the measurements.

Figure 9:
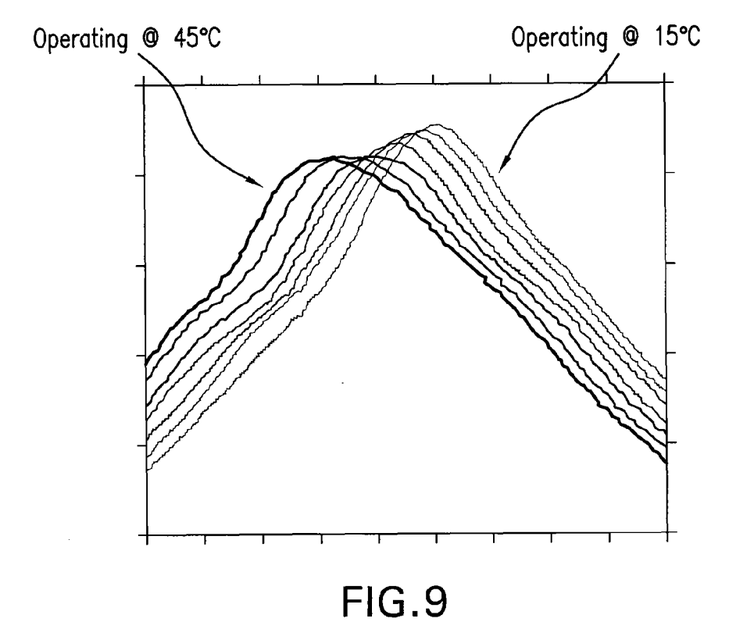
FIG. 9 shows an example of response signals in a temperature calibration mode for a range of temperatures.

FIG. 9 shows a general overview of envelopes of response signals measured in a temperature calibration mode, i.e. when initialising the atomisers, as also explained above with respect to FIGS. 3 and 5, for a range of ambient temperatures, here in steps of 5° C. ranging from §5° to 45° C. As can be seen, the shape of the envelope does not really change, but the peak, thus corresponding to the optimum operating frequency does shift with temperature. The system according to the present invention can thus measure these signals, and as a consequence can then adapt the frequency to ensure correct operation of the atomisers even with varying ambient temperature, and this in a relatively simply, reliable and effective manner. In fact, no separate sensors are required for the measurements, so that the system may be considered self-sensing.

Figure 10:
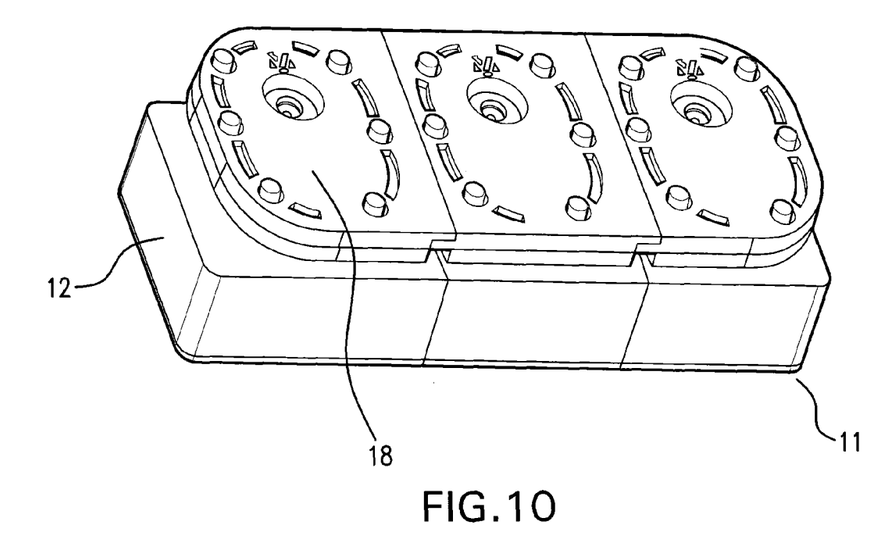
FIG. 10 shows an example of an atomiser arrangement comprising an adaptive piezoelectric actuator control system according to the present invention.

FIG. 10 shows an example of a multiple atomiser arrangement 11. In this example, three removable liquid droplet spray devices 18 are provided in a package 12. Each device has its own reservoir, not shown, in package 12 and each reservoir may be provided with a same or a different liquid. Such multiple atomiser arrangement may be one as described in co-pending application EP 07 002 190.2, incorporated herewith by reference.

The multiple atomiser arrangement 11 comprises the adaptive piezoelectric actuator control system according to the present invention so as to control the spaying of the liquids in a time-controlled manner, and may thus detect, in line with the explanation above, if a reservoir is empty or not, if a spray device functions correctly or not and may also monitor and regulate the optimum operating frequency of the piezoelectric actuator of each spray device.

In a variant, the reservoir may be provided with some identification means, such as a lug, that is indicative of the viscosity of the liquid contained therein. For example, a reservoir containing a perfume may be identified by a limited range of viscosity. This will allow improving overall system performance, as such values can also be pre-stored in RAM 6.

Further, by knowing the viscosity of the liquid, it is possible to adapt the atomiser to spray at a certain flow rate. As is known to a skilled person, the flow rate and the viscosity are temperature-dependent, i.e. the higher the temperature, the lower the viscosity and the higher the flow-rate. In this condition, the adaptive piezoelectric actuator control system, allows adapting the flow rate according to the ambient temperature variation. It is also possible to change the local temperature of the atomiser, i.e. by pre-heating the atomiser in a manner known in the art, thus allowing to decrease the viscosity and thus to increase the flow-rate. In this manner, it is possible to more reliably ensure simultaneous emptying of sequentially spraying atomisers having liquids with different viscosities, as the flow-rate of each atomiser can be adapted according to the local temperature.

By analysing and comparing the different envelopes, it is possible to limit any effects due to variations, such as fabrication tolerances in different liquid droplet spray devices, since the inventive control system can always optimise the functioning.

RAM 6 may use the pre-stored values, and also the values obtained during operation and measurements, so as to automatically adapt and update the look-up tables. In this manner, the RAM and CPU 5 become self-learning.

In a further variant, the CPU may use fuzzy logic for the processing, instead of normal logic processing.

Having described now the preferred embodiments of this invention, it will be apparent to one of skill in the art that other embodiments incorporating its concept may be used. It is felt, therefore, that this invention should not be limited to the disclosed embodiments, but rather should be limited only by the scope of the appended claims.

The invention claimed is:

1. Adaptive piezoelectric actuator control system for a liquid droplet spray device, the system comprising:
   (a) power supply means;
   (b) a piezoelectric actuator;
   (c) a driver operably connected to drive said piezoelectric actuator so as to activate said liquid droplet spray device;
   (d) a signal generator operably connected to provide a frequency signal to said driver for driving said piezoelectric actuator at a frequency as defined by said frequency signal;
   (e) a user interface that allows a user to input operating conditions of said liquid droplet spray device;
   (f) memory means for storing internal parameters and external parameters of said piezoelectric actuator; and
   (g) system control means operably connected to control said power supply means, said driver, said signal generator and said memory means so that the operating frequency of said piezoelectric actuator is monitored and regulated in time so that said piezoelectric actuator operates correctly while consuming as little power as possible,
   wherein said driver comprises
      i. test signal means operably connected to provide a test signal to said piezoelectric actuator, wherein said test signal is provided by said signal generator; and
      ii. voltage measurement means operably connected to measure a voltage applied to said piezoelectric actuator caused by said test signal, and to measure a voltage applied to said piezoelectric actuator caused by said frequency signal, wherein
   said system control means receives a response signal in response to said test signal, and receives said voltages measured by said voltage measurement means, and said system control means comprises signal analysis means for creating an envelope of said response signal and that controls said signal generator to generate a frequency signal corresponding to a maximum of said envelope.

2. Adaptive piezoelectric actuator control system according to claim 1, wherein said memory means is pre-stored with envelopes of said response signal when said piezoelectric actuator is arranged to activate a liquid droplet spray device with a filled reservoir and with an empty reservoir, wherein said system control means is further arranged to compare said envelope created by said system control means with said pre-stored envelopes to determine when said piezoelectric actuator is connected to an empty reservoir or to a filled reservoir.

3. Adaptive piezoelectric actuator control system according to claim 1, wherein said memory means is further arranged to store envelopes of response signals for different ambient temperatures of said piezoelectric actuator, wherein said system control means is further arranged to compare said created envelope with said pre-stored temperature-envelopes so as to determine the temperature of said piezoelectric actuator.

4. Adaptive piezoelectric actuator control system according to claim 2, wherein said memory means is further arranged to store envelopes of response signals for different viscosities of liquids in said reservoir when said piezoelectric actuator is arranged to activate a liquid droplet spray device with a filled reservoir, wherein said system control means is further arranged to compare said envelope created by said system control means with said pre-stored envelopes to determine the operating frequency for a specific viscosity of a liquid when said piezoelectric actuator is connected to a first reservoir.

5. Adaptive piezoelectric actuator control system according to claim 1, wherein said voltage measurement means comprises a first impedance connected between said driver and said piezoelectric actuator for determining a first voltage applied to said piezoelectric actuator, and a first voltage determining branch connected between said piezoelectric actuator and said system control means for providing a value of said first voltage to said system control means.

6. Adaptive piezoelectric actuator control system according to claim 1, further comprising:
(h) a plurality of piezoelectric actuators, wherein each piezoelectric actuator is arranged to drive a liquid droplet spray device;
(i) a switch for sequentially selecting one of said plurality of piezoelectric actuators, wherein said switch is controlled by said system control means.

7. Adaptive piezoelectric actuator control system according to claim 6, wherein said system control means is further arranged to activate one of said piezoelectric actuators so as to heat said piezoelectric actuator, thereby reducing viscosity of any liquid that is acted on by said piezoelectric actuator so as to control flow rate of the liquid droplet spray device.

8. Adaptive piezoelectric actuator control system according to claim 5, wherein the actuator control system further comprises:
(h) a plurality of piezoelectric actuators, wherein each piezoelectric actuator is arranged to drive a liquid droplet spray device; and
(i) a switch for sequentially selecting one of said plurality of piezoelectric actuators, wherein said switch is controlled by said system control means, wherein said voltage measurement means further comprises a second impedance for measuring a second voltage, wherein said second impedance is connected between said driver and said selective switch for providing a value of said second voltage to said system control means.

9. Adaptive piezoelectric actuator control system according to claim 1, wherein said memory means comprises a look-up table having fabrication parameters of said piezoelectric actuator pre-stored therein.

10. Adaptive piezoelectric actuator control system according to claim 1, wherein said internal parameters comprise time-dependent frequency response signals of said piezoelectric actuator for several different temperatures.

11. Adaptive piezoelectric actuator control system according to claim 1, wherein said external parameters comprise ranges of viscosities of liquids at specific temperatures to be used with said liquid droplet spray device.

12. Adaptive piezoelectric actuator control system according to claim 1, wherein said system control means is configured to control said operating frequency by using fuzzy logic.

13. Atomiser comprising:

a plurality of liquid droplet spray devices;

a selector for sequentially selecting one of said liquid droplet spray devices; and an adaptive piezoelectric actuator control system as defined by claim 1.

14. Atomiser according to claim 13, wherein each liquid droplet spray device has a removable reservoir for containing liquid to be ejected as a spray.

15. Atomiser according to claim 14, wherein said reservoir is provided with identification means indicative of the viscosity of a liquid contained therein.

16. Atomiser according to claim 13, further comprising a first indicator for indicating that said reservoir is empty, wherein said first indicator is controlled by said system control means.

17. Atomiser according to claim 16, further comprising a second indicator for indicating that one of said liquid droplet spray devices is malfunctioning, wherein said second indicator is controlled by said system control means.

18. Adaptive piezoelectric actuator control system according to claim 3, wherein said memory means is further arranged to store envelopes of response signals for different viscosities of liquids in said reservoir when said piezoelectric actuator is arranged to activate a liquid droplet spray device with a filled reservoir, wherein said system control means is further arranged to compare said envelope created by said system control means with said pre-stored envelopes to determine the operating frequency for a specific viscosity of a liquid when said piezoelectric actuator is connected to a first reservoir.

* * * * *